United States Patent
Bang et al.

(10) Patent No.: US 12,077,843 B2
(45) Date of Patent: Sep. 3, 2024

(54) COVER MEMBER, ELECTRONIC DEVICE COMPRISING SAME, AND COVER MEMBER MANUFACTURING METHOD

(71) Applicant: Samsung Electronics Co., Ltd., Suwon-si (KR)

(72) Inventors: Hyejin Bang, Suwon-si (KR); Hwanju Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 607 days.

(21) Appl. No.: 17/286,795

(22) PCT Filed: Oct. 17, 2019

(86) PCT No.: PCT/KR2019/013664
§ 371 (c)(1),
(2) Date: Apr. 19, 2021

(87) PCT Pub. No.: WO2020/080851
PCT Pub. Date: Apr. 23, 2020

(65) Prior Publication Data
US 2021/0355574 A1  Nov. 18, 2021

(30) Foreign Application Priority Data
Oct. 19, 2018  (KR) .......................... 10-2018-0125165

(51) Int. Cl.
*C23C 14/08* (2006.01)
*B32B 7/12* (2006.01)
(Continued)

(52) U.S. Cl.
CPC ................ *C23C 14/08* (2013.01); *B32B 7/12* (2013.01); *B32B 17/06* (2013.01); *C23C 14/28* (2013.01);
(Continued)

(58) Field of Classification Search
None
See application file for complete search history.

(56) References Cited

U.S. PATENT DOCUMENTS

| | | |
|---|---|---|
| 2014/0268525 A1 | 9/2014 | Hwang et al. |
| 2015/0167193 A1* | 6/2015 | Demers .................. C25D 11/16 156/151 |
| 2016/0255735 A1 | 9/2016 | Han et al. |

(Continued)

FOREIGN PATENT DOCUMENTS

| | | |
|---|---|---|
| KR | 10-2014-0112326 A | 9/2014 |
| KR | 10-2015-0122609 A | 11/2015 |

(Continued)

OTHER PUBLICATIONS

International Search Report dated Jan. 21, 2020 in connection with International Patent Application No. PCT/KR2019/013664, 2 pages.

(Continued)

*Primary Examiner* — Ramsey Zacharia

(57) ABSTRACT

A cover member of an electronic device according to various embodiments of the present disclosure may comprise: a substrate film layer; a metal oxide layer disposed on the upper surface of the substrate film layer and formed by sputtering; a transparent member attached/disposed on the upper surface of the metal oxide layer; a primer layer disposed on the lower surface of the substrate film layer and made of a semi-transparent material; and a photocurable resin layer disposed on the lower surface of the primer layer, the photocurable resin layer comprising, on a surface thereof, a pattern structure in a designated stereoscopic shape. Other embodiments are also possible.

13 Claims, 7 Drawing Sheets

(51) Int. Cl.
    *B32B 17/06*      (2006.01)
    *C23C 14/28*      (2006.01)
    *C23C 14/34*      (2006.01)
    *H05K 5/03*      (2006.01)

(52) U.S. Cl.
    CPC ...... *C23C 14/3407* (2013.01); *B32B 2255/20* (2013.01); *B32B 2255/26* (2013.01); *B32B 2307/412* (2013.01); *B32B 2457/00* (2013.01); *H05K 5/03* (2013.01)

(56) References Cited

U.S. PATENT DOCUMENTS

| | | |
|---|---|---|
| 2017/0155417 A1 | 6/2017 | Jeong et al. |
| 2018/0249586 A1 | 8/2018 | Kim et al. |

FOREIGN PATENT DOCUMENTS

| | | |
|---|---|---|
| KR | 10-2016-0005642 A | 1/2016 |
| KR | 10-2016-0105110 A | 9/2016 |
| KR | 10-2017-0019117 A | 2/2017 |
| KR | 10-2018-0073236 A | 7/2018 |

OTHER PUBLICATIONS

Written Opinion of the International Searching Authority dated Jan. 21, 2020 in connection with International Patent Application No. PCT/KR2019/013664, 4 pages.

Request for the Submission of an Opinion dated Dec. 20, 2022 in connection with Korean Patent Application No. 10-2018-0125165, 20 pages.

\* cited by examiner

COVER MEMBER, ELECTRONIC DEVICE COMPRISING SAME, AND COVER MEMBER MANUFACTURING METHOD

CROSS-REFERENCE TO RELATED APPLICATIONS

This application is a 371 of International Application No. PCT/KR2019/013664 filed on Oct. 17, 2019, which claims priority to Korean Patent Application No. 10-2018-0125165 filed on Oct. 19, 2018, the disclosures of which are herein incorporated by reference in their entirety.

BACKGROUND

1. Field

Various embodiments of the disclosure relate to a cover member, an electronic device including the same, and a cover member manufacturing method.

2. Description of Related Art

An electronic device may refer to a device configured to perform a specific function according to an installed program, such as a home appliance, an electronic wallet, a portable multimedia player, a mobile communication terminal, a tablet PC, an image/sound device, a desktop/laptop computer, and a vehicle navigation. For example, such electronic devices may output stored information as sounds or images. In line with increasing degrees of integration of electronic devices and widespread use of super-fast and large-capacity wireless communication, it has recently become possible to equip a single electronic device (for example, a mobile communication terminal) with various functions. For example, not only a communication function, but also an entertainment function (for example, gaming), a multimedia function (for example, music/moving image playback), a communication/security function for mobile banking or the like, a scheduling function, or an electronic wallet function tend to be integrated in a single electronic device.

In line with recent attention to compactness, flatness, and portability of electronic devices (for example, smartphones and/or laptops), attempts have been made to employ a glass material component, which is aesthetic from a design point of view, and to apply the same to an electronic device exterior material. In addition, various surface treatment technologies have teen developed to give the exterior material of the glass material component a functional effect in addition to design-related effects.

In line with the increasing attention to portability of electronic devices (for example, smartphones or laptops), exterior materials thereof need to have a high level of strength, and there is an increasing design-related demand for providing aesthetic appearances through various colors. Exterior materials of electronic devices are commonly manufactured by using a process based on E-beam evaporation, in order to implement an impression of color.

However, exterior materials manufactured to implement colors through E-beam evaporation cannot provide the same impression of reflection according to the direction of light reaching the exterior materials, thereby making it difficult to express uniform colors through the entire exterior materials. This may degrade the production yield of the exterior materials.

Moreover, exterior materials manufactured to implement colors solely through E-beam evaporation cannot provide a color expression that exhibits a depth perception, and fail to implement appearances that give soft feelings like that of a ceramic surface.

Various embodiments of the disclosure may provide a cover member which gives a uniform impression of color in connection with the exterior material of an electronic device, and which has an improved impression of reflection and thus implements a color that exhibits a depth perception.

Various embodiments of the disclosure may implement a surface like a ceramic texture, which has a high degree of design-related demand, in connection with the exterior material of an electronic device.

SUMMARY

A cover member of an electronic device according to various embodiments of the disclosure may include: a substrate film layer; a metal-oxide layer disposed on an upper surface of the substrate film layer and formed by sputtering; a transparent member bonded to an upper surface of the metal-oxide layer; a primer layer disposed on a lower surface of the substrate film layer and made of a translucent material; and a photocurable resin layer disposed on a lower surface of the primer layer and including a pattern structure having a designated three-dimensional shape on a surface thereof.

An electronic device according to various embodiments of the disclosure may include: a housing including a rear cover facing a first direction and a front cover facing a second direction opposite to the first direction faced by the rear cover, the front cover including a transparent region in at least a portion thereof a battery disposed in the housing; and a display device disposed in the housing and including a screen region exposed through the front cover.

The rear cover may include: a substrate film layer; a metal-oxide layer disposed on a surface of the substrate film layer, facing the first direction, and formed by sputtering; a transparent member bonded to a surface of the metal-oxide layer, facing the first direction; a primer layer made of a translucent material and disposed on a surface of the substrate film layer, facing the second direction; a photocurable resin layer including a pattern structure having a designated three-dimensional shape on a surface thereof and disposed on a surface of the primer layer, facing the second direction; and a deposition layer formed through an electron beam (E-beam) evaporation or sputtering, and disposed on a surface of the photocurable resin layer, facing the second direction.

A method for manufacturing a cover member disposed in an electronic device according to various embodiments of the disclosure may include: disposing a metal-oxide layer on the upper surface of a substrate film layer by sputtering; disposing a transparent member made of a glass material on the upper surface of the metal-oxide layer; disposing, on the lower surface of the substrate film layer, a primer layer and a photocurable resin layer including a pattern structure having a designated three-dimensional shape; and disposing, on the lower surface of the photocurable resin layer, a printing layer configured to block the path of light emitted out of or into the electronic device.

A cover member constituting an electronic device according to various embodiments of the disclosure may form an interference effect and diffuse reflection, as in the case of a prism, through a micropattern structure formed on a photocurable resin layer, and this may provide the cover member with a color expression that exhibits a depth perception.

A cover member constituting an electronic device according to various embodiments of the disclosure may implement a surface like a ceramic texture, which has a high degree of design-related demand.

A cover member constituting an electronic device according to various embodiments of the disclosure may implement a chromatic color that has uniformity as a whole.

DETAILED DESCRIPTION

Figure 1:
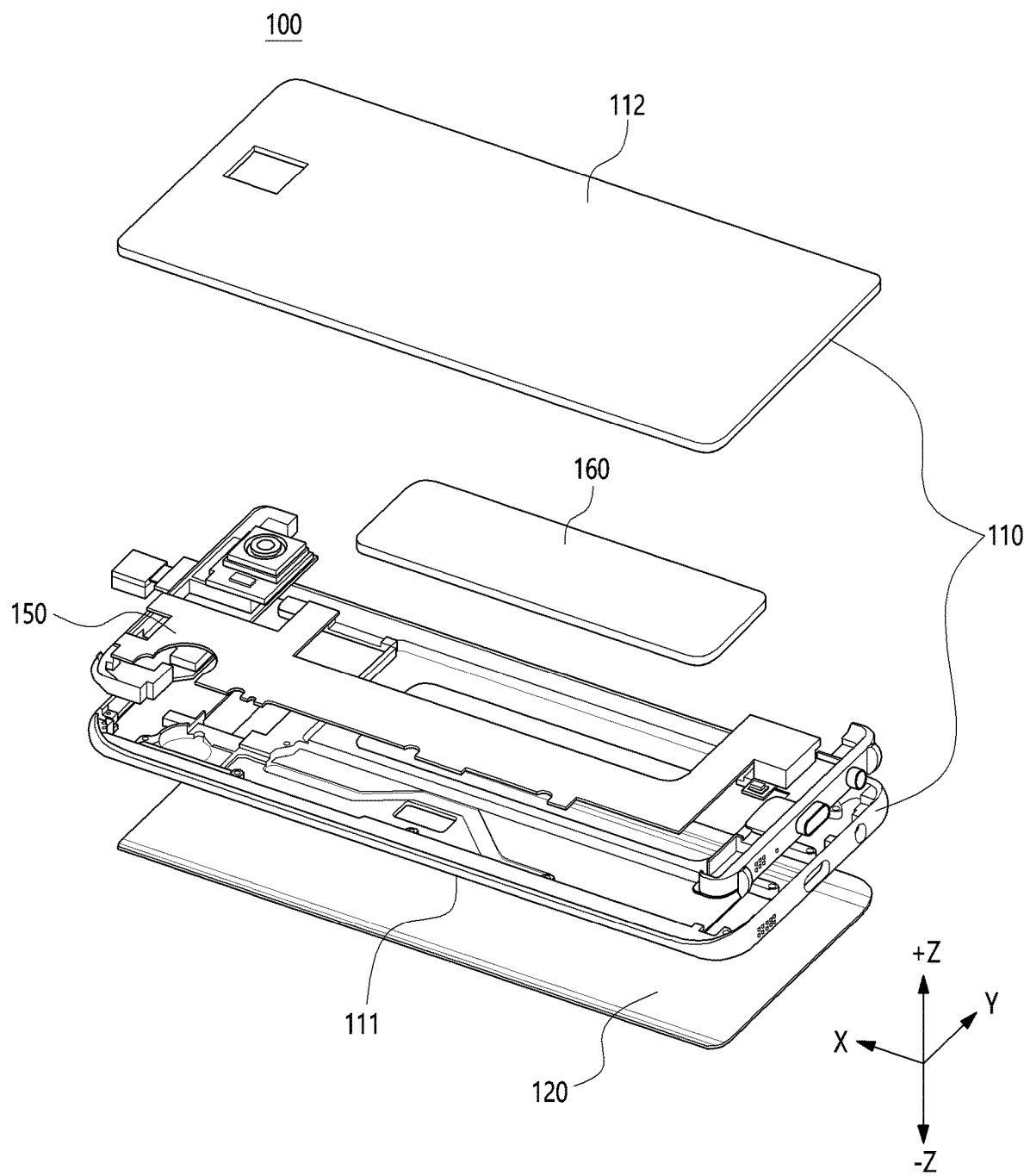
FIG. 1 is an exploded perspective view of an electronic device including a housing which is at least partially made of a glass material according to various embodiments of the disclosure.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. The electronic device according to embodiments of the disclosure is not limited to those described above.

It should be appreciated that various embodiments of the disclosure and the terms used therein are not intended to limit the technological features set forth herein to particular embodiments and include various changes, equivalents, and/or alternatives for a corresponding embodiment. With regard to the description of the drawings, similar reference numerals may be used to designate similar or relevant elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

Various embodiments as set forth herein may be implemented as software (e.g., program) including one or more instructions that are stored in a storage medium (e.g., internal memory or external memory) that is readable by a machine (e.g., electronic device). For example, a processor (e.g., processor of electronic device) of the machine (e.g., electronic) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities. According to various embodiments, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added. Hereinafter, an electronic device according to various embodiments will be described with reference to the accompanying drawings. In the disclosure, the term "user" may refer to a person using an electronic device or a device (e.g., an artificial intelligence electronic device) using an electronic device.

An exterior material including a glass material according to various embodiments of the disclosure may have various types of outer surfaces depending on a formation space. For example, the outer surface of an electronic device, formed by surface treatments through plurality of coating layers on a surface of tempered glass, may be made of a dense oxide, and thus may have excellent corrosion resistance and abrasion resistance, and may have a decorative appearance expressing a haze texture.

An exterior material of an electronic device according to various embodiments of the disclosure forms multiple layers of cover and is provided as a composition. In another example, a method for manufacturing an exterior material is provided. An exterior material having excellent surface properties and mechanical properties may be provided by increasing the strength of bonding between the glass member and multiple laminated coating layers through heat treatment.

A cover member according to various embodiments of the disclosure may be used as a component for an interior or exterior material, which should be thin and have a high strength, provided for a portable electronic device. For example, the portable electronic device may be an electronic device including a display device.

FIG. 1 is an exploded perspective view of an electronic device 100 including a housing 110 which is at least partially made of a glass material according to various embodiments.

Referring to FIG. 1, the electronic device 100 according to various embodiments of the disclosure may include the housing 110 including a rear cover 112 facing a first direction (+Z) and a front cover 111 facing a second direction (−Z) opposite to the direction faced by the rear cover 112. The housing 110 may include a transparent region forming at least a portion of the front cover. The electronic device 100 according to an embodiment may include a display device 120 which is disposed in the housing 110 and includes a screen region exposed through the front cover 111. At least a portion of the housing 110 may be formed of a glass material (e.g., cover glass), and at least one coating layer may be applied on the glass material.

According to various embodiments, the housing 110, which is configured to receive various types of electronic components, may be at least partially formed of a conductive material. For example, the housing 100 may include side walls forming the outer surface of the electronic device 100. Alternatively, a portion of the housing 110, which is exposed as the exterior of the electronic device 100, may include a conductive material. A printed circuit board 150 and/or a battery 160 may be received in the housing 110. For example, a processor, a communication module, various types of interfaces, a power management module, or a control circuit may be formed in the form of an integrated circuit chip and mounted on the printed circuit board 150. For example, the control circuit may be a portion of the above-described processor or communication module.

According to various embodiments, the display device 120 may be at least partially made of a material through which a radio frequency or a magnetic field passes. For example, the display device 120 may include: a window member made of a tempered glass material; and a display panel mounted on the inner surface of the window member. A touch panel may be mounted between the window member and the display device. For example, the display device 120 may be an output device configured to output a screen, and may be simultaneously used as an input device having a touch-screen function.

Figure 2:
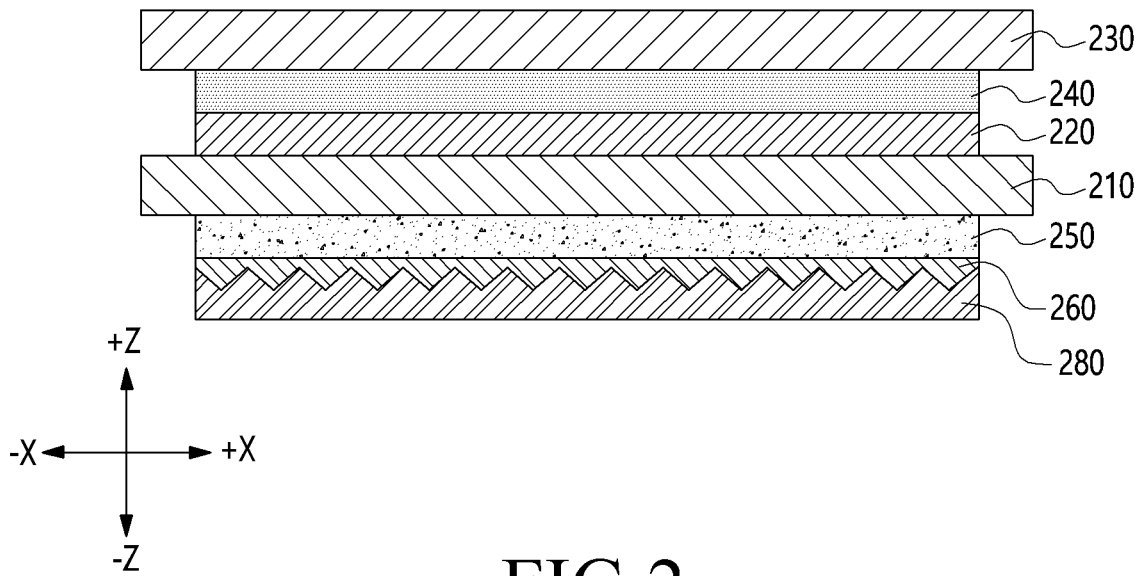
FIG. 2 is a cross-sectional view showing the cross section of a partial region of a cover member according to various embodiments of the disclosure.

FIG. 2 is a cross-sectional view showing the cross section of a partial region of a cover member 200 according to various embodiments of the disclosure.

In FIG. 2, "X" in a two-axis orthogonal coordinate system may refer to the longitudinal direction of the cover member 200, and "Z" in the two-axis orthogonal coordinate system may refer to the thickness direction of the cover member 200. Further, in an embodiment of the disclosure, "Z" may refer to a first direction (+Z-axis direction) and a second direction (−Z-axis direction), and '"X" may refer to a third direction (+X or −X).

Referring to FIG. 2, the cover member 200 used as the exterior material of an electronic device (e.g., the electronic device 100 in FIG. 1) may be manufactured by laminating a plurality of layers. In the cover member 200, a transparent member 230 may form the outer surface of the cover member, and a metal-oxide layer 220, a substrate film layer 210, a primer layer 250, a photocurable resin layer 260 and a printing layer 280 may be laminated inward from the transparent member 230. The cover member 200 in FIG. 2 may be partially or totally identical to the housing 110 in FIG. 1.

According to various embodiments, the electronic device 100 such as a mobile device may include the cover member 200 configured to cover the outer surface thereof, and the cover member 200 may be a rear cover and/or a front bezel region, which substantially forms an inactive region of the electronic device.

According to various embodiments, in the cover member 200, a plurality of layers may be laminated on each of the upper surface and the lower surface of the substrate film layer 210. For example, in the cover member 200, a metal-oxide layer 220, a dielectric layer 240, and a transparent member 230 may be laminated in a first direction (+Z-axis direction) of the substrate film layer 210. In another example, in the cover member 200, a primer layer 250, a photocurable resin layer 260, and a printing layer 280 may be laminated in a second direction (−Z-axis direction) opposite to the first direction (+Z-axis direction) of the substrate film layer 210. The substrate film layer 210 may be formed of a transparent insulation substrate such as glass or a polymer film. When the substrate is formed of a polymer film, the substrate may include a flexible substrate.

According to various embodiments, the metal-oxide layer 220 may be laminated in the upper surface of the cover member 200. For example, the metal-oxide layer 220 may be manufactured on a surface of the substrate film layer 210 that faces the first direction (+Z-axis direction) by physical vapor deposition (PVD) such as sputtering. The physical vapor deposition (PVD) is a method for separating a deposition material from a target (a raw deposition material) in a vacuum state, changing the deposition material into a gas state, and placing and depositing the gaseous deposition material on a substrate, wherein the deposition material is changed into a solid state by physical collision with the substrate to form a thin film. According to an embodiment, a metal oxide for the metal-oxide layer 220 may be deposited containing at least one of materials such as $Nb_2O_5$, $ZnS$, $TiO$, $SiO$, $Al$, $Sn$, or $Tin$, and may be a thin film having a thickness of about 2 μm to 3 μm. The metal-oxide layer 220 may have, through the diffuse reflection of light, a color providing a perception of depth, for example, a color representing a ceramic texture. In another example, the metal-oxide layer 220 has diffuse reflection and interference effects together with the deposition layer 270, whereby the cover member 200 exhibiting a perception of depth may be provided.

According to various embodiments, the transparent member 230 may be laminated on the metal-oxide layer 220. For example, the transparent member 230 may be bonded to a surface of the metal-oxide layer 220 that faces the first direction (+Z-axis direction). The dielectric layer 240 may be disposed between the metal-oxide layer 220 and the transparent member 230. The dielectric layer 240 may be brought into contact with and disposed on the transparent member 230, and may be manufactured by applying a composition widely known as an optically transparent adhesive layer, without any particular limitation. For example, the dielectric layer 240 may be manufactured using an acrylic adhesive. In another example, the dielectric layer 240 may include at least one of silicon, air, foam, a membrane, an optical clear adhesive (OCA), sponge, rubber, ink, and polymer (PC or PET). The dielectric layer 240 may be provided to bond the transparent member 230 and/or the metal-oxide layer 220 or to have a refractive index that is different from those of the transparent member 230 and/or the metal-oxide layer 220.

According to various embodiments, the thickness of the dielectric layer 240 may be formed to be sufficient to support the transparent member 230. For example, the thickness of the dielectric layer 240 may be about 15 μm to about 35 μm, and may be, for example, about 20 μm. The cover member 200 may be implemented in a thin form by using the dielectric layer 240 having a thickness falling within the range.

According to an embodiment, the transparent member 230 forms the outermost layer of the cover member 200, and may be formed of a transparent insulation substrate such as a glass film or a polymer film.

According to various embodiments, the lower surface of the cover member 200 may include the primer layer 250 and the photocurable resin layer 260 laminated together. The primer layer 250 and the photocurable resin layer 260 may be disposed on a surface of the substrate film layer 210 in the second direction (−Z), and may have various colors. For example, the primer layer 250 may be formed of a translucent material, and may be implemented so as to include a designated color. In another example, the photocurable resin layer 260 may include a plurality of micropatterns for expressing the three-dimensional effect of color. The primer layer 250 and the photocurable resin layer 260 may be manufactured through a photolithography method or through an imprint lithography method for using an inorganic or polymeric mold, in which desired micropatterns are pre-formed, to bond a coated curable composition onto a metal film or an organic film and cure the composition by using heat or light, thereby forming patterns.

According to various embodiments, the photocurable resin layer 260 may be crosslinked and/or cured by receiving light energy such as ultraviolet (UV) rays, etc. According to an embodiment, the photocurable resin layer 260 has excellent strength of adhesion to a substrate, heat resistance, durability (at high temperature, high pressure, and high humidity), and lower film protection characteristics and maintains high transmittance even after high-temperature processing, and thus can be useful for forming a micropattern or a protection film.

According to various embodiments, the photocurable resin layer 260 may be arranged opposite to the transparent member 230 with the substrate film layer 210 interposed therebetween, and may have transmittance high enough to transmit light received from the transparent member 230. In another example, the photocurable resin layer 260 may have a flexible structure corresponding to the flexible structure of the transparent member 230.

According to various embodiments, the photocurable resin layer 260 may include a base resin, a reactive diluent, a photopolymerization initiator, and various other types of additives. For example, a base resin (oligomer), among the additives used for the photocurable resin layer 260, is an important component that affects the physical properties of a resin, and may form a polymer bond through a polymerization reaction to form a cured film. The base resin may be classified as a polyester-based resin, an epoxy-based resin, a urethane-based resin, a polyether-based resin, a polyacryl-based resin, etc. according to the backbone thereof. In another example, a reactive diluent (monomer), among the additives used for the photocurable resin layer 260, may serve as a diluent or cross-linker of the reactive oligomer, and may polymerize to form a cured film. In another example, a photopolymerization initiator, among the additives used for the photocurable resin layer 260, is the most basic raw material of UV curable resin. The photopolymerization initiator may play a role of absorbing ultraviolet rays to generate a radical or a cation, thereby initiating polymerization, and may be used alone or with two or three mixed materials. In another example, other additives used for the photocurable resin layer 260 may include a photosensitizer, a coloring agent, a thickener, a polymerization inhibitor, etc. This may additionally impart a special capability to a resin in response to needs of a user or needs of industries.

According to various embodiments, the photocurable resin layer 260 may include a pattern structure having a designated shape. The shape and array structure of the pattern structure will be described in detail with reference to FIG. 4.

According to various embodiments, the printing layer 280 may be laminated on the bottom surface of the photocurable resin layer 260. For example, the printing layer 280 may be disposed on a surface of the photocurable resin layer 260 that faces the second direction (−Z), and may include recesses having a shape corresponding to the shape of patterns, so as to cover the pattern structure formed at the photocurable resin layer 260. A surface of the printing layer 280, opposite to the pattern structure, may be formed to be flat.

According to various embodiments, the printing layer 280 may include at least one layer, and may block the path of light emitted out of or into the electronic device 100. For example, the printing layer 280 may prevent a phenomenon of light leakage from the electronic device 100, or may block light provided from the outside to the electronic device 100. According to an embodiment, the printing layer 280 may be formed of a material using black ink, and may be manufactured in a base printing process. In another example, the printing layer 280 may be formed of a material using black ink, and may be manufactured in a light-blocking printing process.

Figure 3:
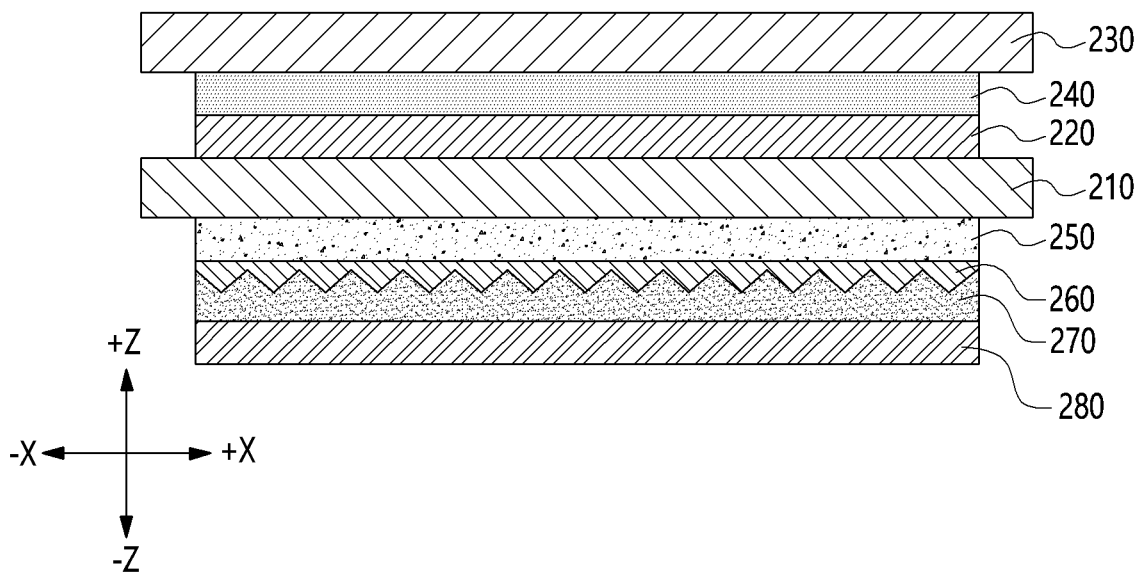
FIG. 3 is a cross-sectional view showing the cross section of a partial region of a cover member according to another embodiment of the disclosure.

FIG. 3 is a cross-sectional view showing the cross section of a partial region of the cover member 200 according to another embodiment of the disclosure.

In FIG. 3, "X" in a two-axis orthogonal coordinate system may refer to the longitudinal direction of the cover member 200, and "Z" in the two-axis orthogonal coordinate system may refer to the thickness direction of the cover member 200. Further, in an embodiment of the disclosure, "Z" may refer to a first direction (+Z-axis direction) and a second direction (−Z-axis direction), and "X" may refer to a third direction (+X or −X).

Referring to FIG. 3, the cover member 200 used as the exterior material of an electronic device may be manufactured by laminating a plurality of layers. According to various embodiments, in the cover member 200, a plurality of layers may be laminated on each of the upper surface and the lower surface of a substrate film layer 210. For example, in the cover member 200, a metal-oxide layer 220, a dielectric layer 240, and a transparent member 230 may be laminated in a first direction (+Z-axis direction) of the substrate film layer 210. In another example, in the cover member 200, a primer layer 250, a photocurable resin layer 260, a deposition layer 270, and a printing layer 280 may be laminated in a second direction (−Z-axis direction) opposite to the first direction (+Z-axis direction) of the substrate film layer 210.

In the cover member 200 in FIG. 3, the configurations of the transparent member 230, the dielectric layer 240, the metal-oxide layer 220, the substrate film layer 210, the primer layer 250, and the photocurable resin layer 260 in FIG. 2 may be applied to the configurations of the transparent member 230, the dielectric layer 240, the metal-oxide layer 220, the substrate film layer 210, the primer layer 250, and the photocurable resin layer 260. Hereinafter, the configurations of the deposition layer 270 and the printing layer 280 of the cover member 200 in FIG. 3 that differ from the elements in FIG. 2 will be described in detail.

According to various embodiments, the deposition layer 270 may be disposed between the photocurable resin layer 260 and the printing layer 280. For example, the photocurable resin layer 260 is laminated, and then the deposition layer 270 may be formed in micropatterns by electron beam (E-beam)-type evaporation. In another example, the deposition layer 270 may be manufactured using physical vapor deposition such as sputtering.

According to various embodiments, the deposition layer 270 may be formed as at least one layer. For example, the deposition layer 270 formed as one layer may be manufactured using an electron beam (E-beam) evaporator, including an indium oxide and an additional additive. The additional additive may include at least one of TiO2, SiO2, or Al2O3. In another example, the deposition layer 270 formed as a plurality of layers may be formed by alternately depositing two materials (e.g., an indium oxide and at least one of TiO2, SiO2, and Al2O3 are used) different in reflectivity from each other by using an electron beam (E-beam) evaporator. When the deposition layer 270 is formed by sputtering, the deposition layer 270 including at least one of materials such as Nb2O5, ZnS, TiO, SiO, Al, Sn, or Tin may be deposited. The deposition layer formed by sputtering is a thin film, and may have diffuse reflection and interference effects together with the metal-oxide layer 220, and thus the cover member 200 exhibiting a perception of depth can be provided.

According to various embodiments, the deposition layer 270 may implement a silver color as a base color. Due to a laminated structure in which the deposition layer 270 is laminated with the primer layer 250 having a translucent color, the deposition layer 270 may implement various colors while using a silver color as a base color, and may implement a high-yield color layer, the overall uniformity of which is not reduced depending on the direction of light. Therefore, the production yield of the cover member 200 may be increased.

According to various embodiments, in order to cover the structure of micropatterns arranged on a surface of the photocurable resin layer 260, the deposition layer 270 may include recesses having a shape corresponding to the shape of the patterns. A surface of the deposition layer 270, opposite to the pattern structure, may be formed to be flat, and may be arranged in contact with the printing layer 280.

According to various embodiments, the printing layer 280 may be laminated on the lower surface of the deposition layer 270. For example, the printing layer 280 may be disposed on a surface of the deposition layer 270, facing the second direction (−Z), and may be formed as at least one layer. The printing layer 280 may block the path of light emitted out of or into the electronic device 100. For example, the printing layer 280 may prevent a phenomenon of light leakage from the electronic device 100 or may block light provided from the outside to the electronic device 100. According to an embodiment, the printing layer 280 may be formed of a material using black ink, and may be manufactured in a base printing process. In another example, the printing layer 280 may be formed of a material using black ink, and may be manufactured in a light-blocking printing process.

Figure 4:
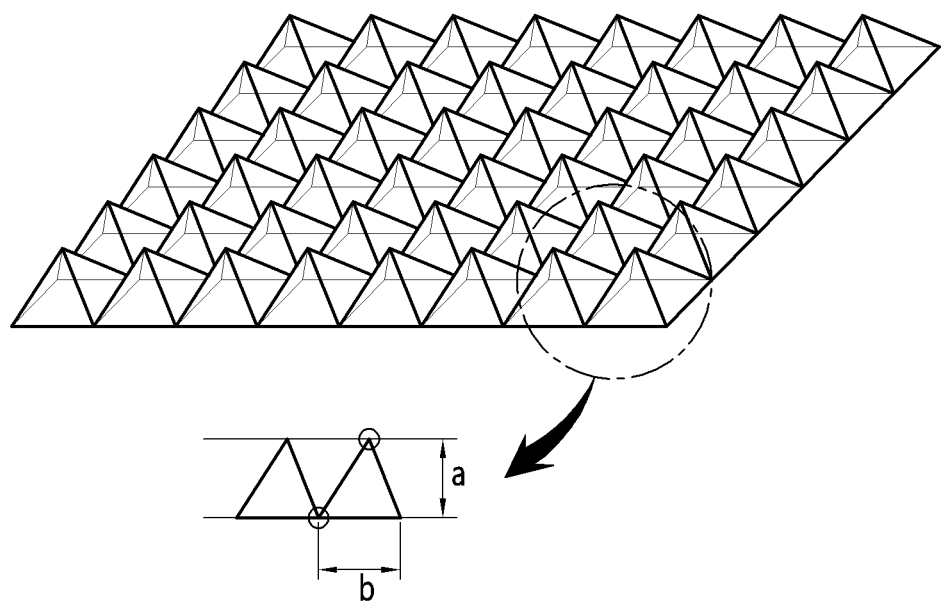
FIG. 4 illustrates an extended partial region of a photocurable resin layer according to various embodiments of the disclosure.

FIG. 4 illustrates an extended partial region of a photocurable resin layer according to various embodiments of the disclosure.

Referring to FIGS. 2 to 4, in the cover member 200, the metal-oxide layer 220, the dielectric layer 240, and the transparent member 230 may be laminated in the first direction (+Z-axis direction) of the substrate film layer 210. In another example, in the cover member 200, the primer layer 250, the photocurable resin layer 260, and the printing layer 280 may be laminated in the second direction (−Z-axis direction) opposite to the first direction (+Z-axis direction) of the substrate film layer 210.

The photocurable resin layer 260 illustrated in FIG. 4 corresponds to the photocurable resin layer 260 in FIGS. 2 to 4 rotated by 180 degrees. The photocurable resin layer 260 may include a first surface facing the primer layer; and a second surface facing the inside of the electronic device, and the second surface may include an array of a plurality of three-dimensional shapes.

According to various embodiments, the photocurable resin layer 260 may form a pattern structure having a designated shape, and the pattern structure may be formed over the entirety of the photocurable resin layer 260. The pattern structure may be formed of one of a decoration pattern, a three-dimensional pattern formed of fine hairlines, a molding pattern, and repeated patterns. For example, the pattern structure may be provided to include a number of miniscule concave and convex shapes. In another example, the pattern structure may be a structure in which a plurality of quadrangular pyramid shapes (e.g. pyramid shapes) are repeatedly arrayed. For example, an array of the plurality of quadrangular pyramid shapes may form a periodic pattern, and each of the quadrangular pyramid shapes may have an area decreasing in a direction away from the primer layer 250 (e.g., in the second direction (−Z-axis direction)).

According to an embodiment, one quadrangular pyramid shape in the pattern structure has a height (a) of about 3 μm to 10 μm and a width (b) of about 25 μm to 50 μm. In another example, one quadrangular pyramid shape may have a height (a) of about 5 μm and a width (b) of about 30 μm.

According to an embodiment, the photocurable resin layer 260 may be formed on a surface of the primer layer 250 provided as a translucent color layer. The micropattern structure of the photocurable resin layer 260 may provide an impression of color together with the primer layer 250. In another example, the pattern structure of the photocurable resin layer 260 may provide a light interference effect, a prism effect, or diffuse reflection due to a three-dimensional structure, and thus may implement a three-dimensional effect and depth even when the photocurable resin layer 260 is formed as a thin layer.

According to an embodiment, the micropattern structure of the photocurable resin layer 260 may maintain the cover member 200 in a substantially hazy state. For example, the hazy state indicates a translucent state or misty state in which a user's field of vision is blurred, and may be an intermediate state from transparency to opacity according to a haze % value. Therefore, the cover member 200 may implement the same effect as a ceramic texture together with the metal-oxide layer 220.

Figure 5:
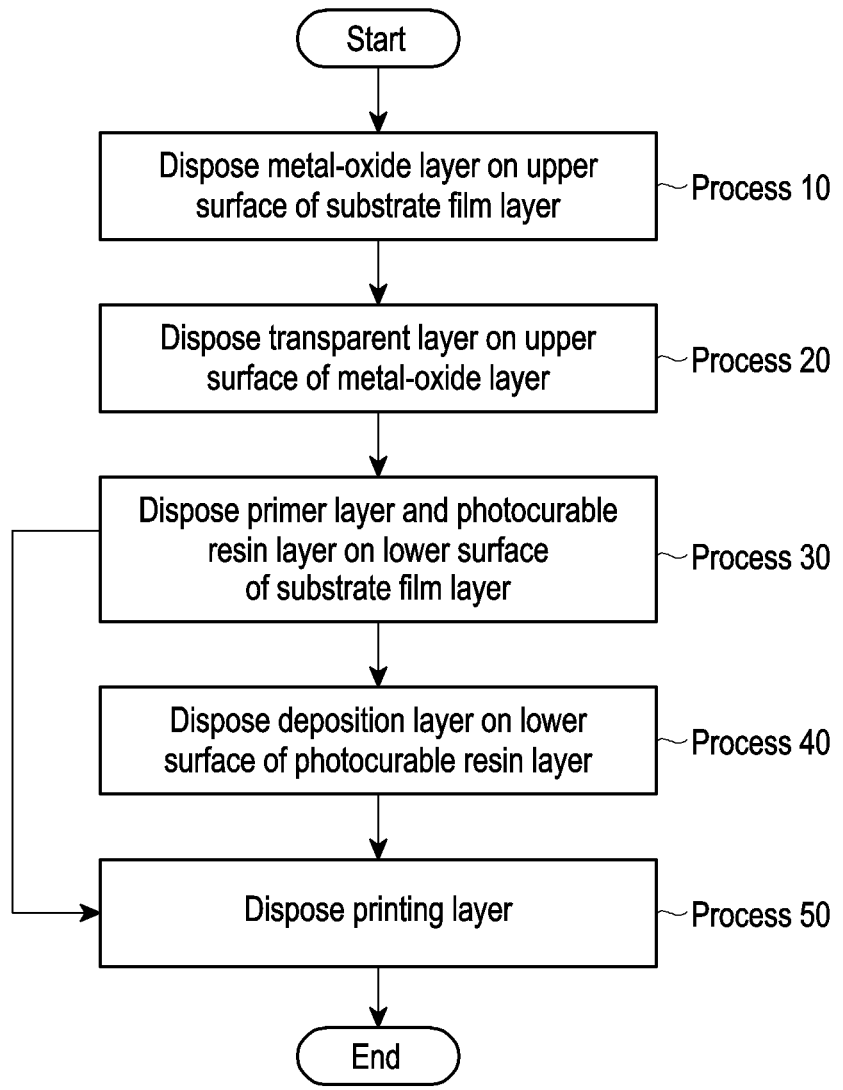
FIG. 5 is a flowchart showing processes of forming a cover member according to various embodiments of the disclosure.
Figure 6:
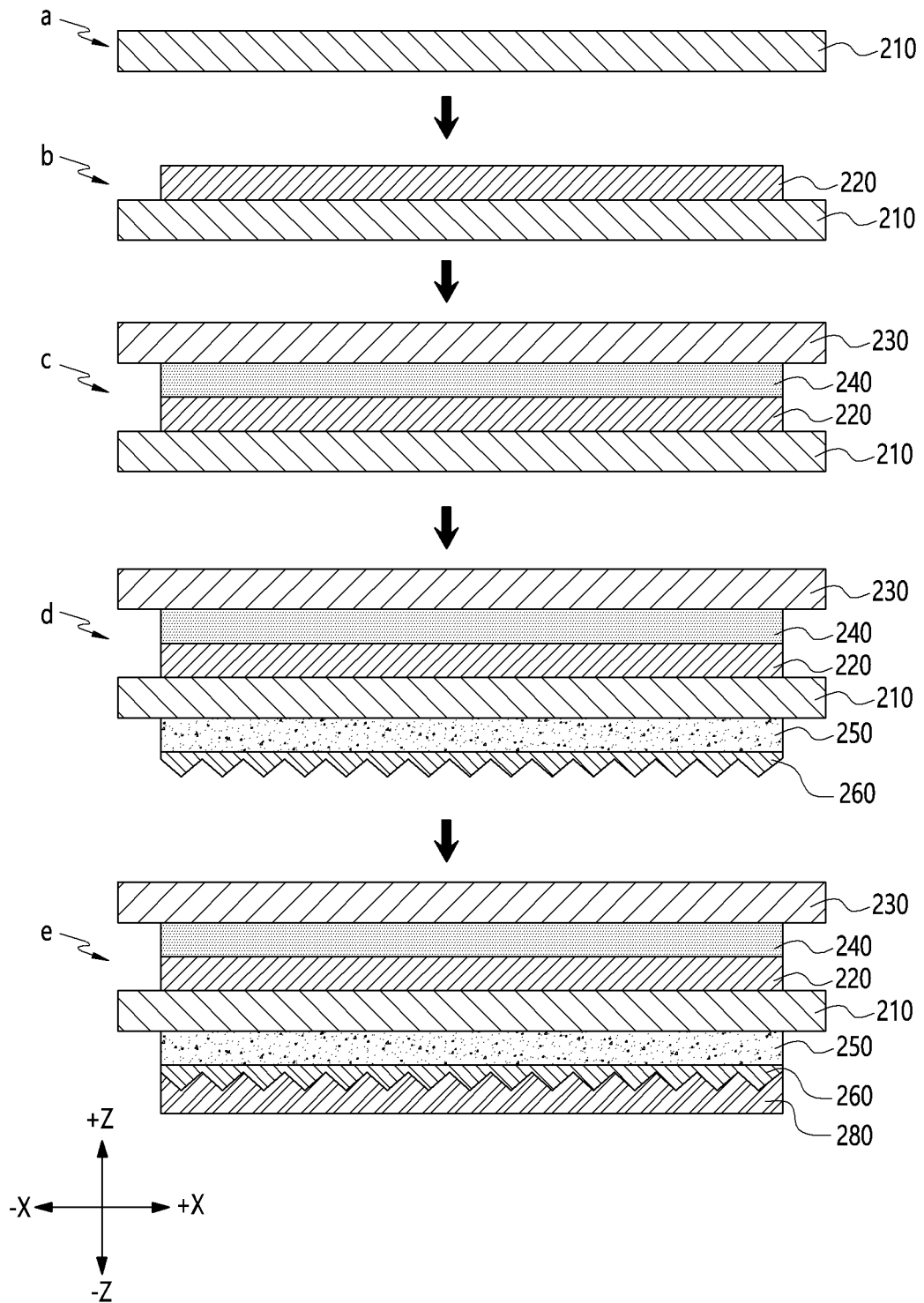
FIG. 6 schematically illustrates the flowchart in FIG. 5, and may provide processes of forming the cover member illustrated in FIG. 2.

FIG. 5 is a flowchart showing processes of forming a cover member according to various embodiments of the disclosure. FIG. 6 schematically illustrates the flowchart in FIG. 5, and may provide processes of forming the cover member 200 illustrated in FIG. 2.

In FIG. 6, "X" in a two-axis orthogonal coordinate system may refer to the longitudinal direction of the cover member 200, and "Z" in the two-axis orthogonal coordinate system may refer to the thickness direction of the cover member 200. Further, in an embodiment of the disclosure, "Z" may refer to a first direction (+Z-axis direction) and a second direction (−Z-axis direction), and "X" may refer to a third direction (+X or −X).

Referring to FIGS. 5 and 6, the cover member 200 may be manufactured by laminating a plurality of layers. In the cover member 200, with reference to the substrate film layer 210, a plurality of layers may be laminated in a first direction (+Z-axis direction), and then a plurality of layers may be laminated in a second direction (−Z-axis direction). The structures of layers of the cover member 200 in FIG. 5 may be partially or totally identical to the structures of layers of the cover member 200 in FIG. 2.

In order to manufacture the cover member 200, the substrate film layer 210 may be provided first (process (a) in FIG. 6). The substrate film layer 210 may be formed of a transparent insulation substrate such as a glass or polymer film, and when the substrate is formed of a polymer film, the substrate may include a flexible substrate. The substrate film layer 210 is a support layer supporting a plurality of layers such that the plurality of layers can be laminated, and may have a thickness of about 40 μm to 60 μm. In another example, the substrate film layer 210 may have a thickness of about 50 μm.

Subsequently, the metal-oxide layer 220 may be disposed on the upper surface of the substrate film layer 210 (process 10) (process (b) in FIG. 6). The metal-oxide layer 220 may be formed on a surface of the substrate film layer 210 that faces the first direction (+Z-axis direction) by physical vapor deposition (PVD) such as sputtering. A metal oxide used for the metal-oxide layer 220 may include at least one of materials such as Nb2O5, ZnS, TiO, SiO, Al, Sn, or Tin. The metal-oxide layer 220 may have a color providing a perception of depth, for example, a ceramic texture through diffuse reflection of light.

After the metal-oxide layer 220 is laminated, the transparent member 230 may be disposed on the upper surface of the metal-oxide layer 220 (process 20) (process (c) in FIG. 6). The transparent member 230 may have an adhesive property, and may adhere to a surface of the metal-oxide layer 220, facing the first direction (+Z-axis direction), through the transparent dielectric layer 240. The transparent member 230 may form the outermost layer of the cover member 200, and may be formed of a transparent insulation substrate such as a glass or polymer film.

After the metal-oxide layer 220 is laminated, a plurality of film layers may be laminated on the lower surface of the substrate film layer 210. The primer layer 250 and the photocurable resin layer 260 may be disposed on the lower surface of the substrate film layer 210 (process 30) (process (d) in FIG. 6). The primer layer 250 and the photocurable resin layer 260 may be disposed on a surface of the substrate film layer 210, facing the second direction (−Z-axis direction), to provide the impression of color and a three-dimensional effect.

According to an embodiment, the primer layer 250 includes a translucent material and a colored material, and may be formed as a base layer for the photocurable resin layer 260. The photocurable resin layer 260 may include a micropattern structure designated as a layer which is capable of being crosslinked and/or cured by receiving light energy such as ultraviolet (UV) rays, etc. The micropattern structure of the photocurable resin layer 260 may provide, by using the same diffuse reflection or interference effect of light as that of a prism, the primer layer 250 with the impression of color showing a perception of depth.

After the photocurable resin layer 260 is formed, the printing layer 280 may be disposed on the lower surface of the photocurable resin layer 260 (process 50) (process (e) in FIG. 6). The printing layer 280 may be disposed on a surface of the photocurable resin layer 260 that faces the second direction (−Z-axis direction), and may have a shape corresponding to the micropattern structure so as to receive the micropattern structure. The printing layer 280 may be formed as at least one layer, and may prevent a phenomenon of light leakage from an electronic device or may block light provided from the outside to the electronic device 100.

Figure 7:
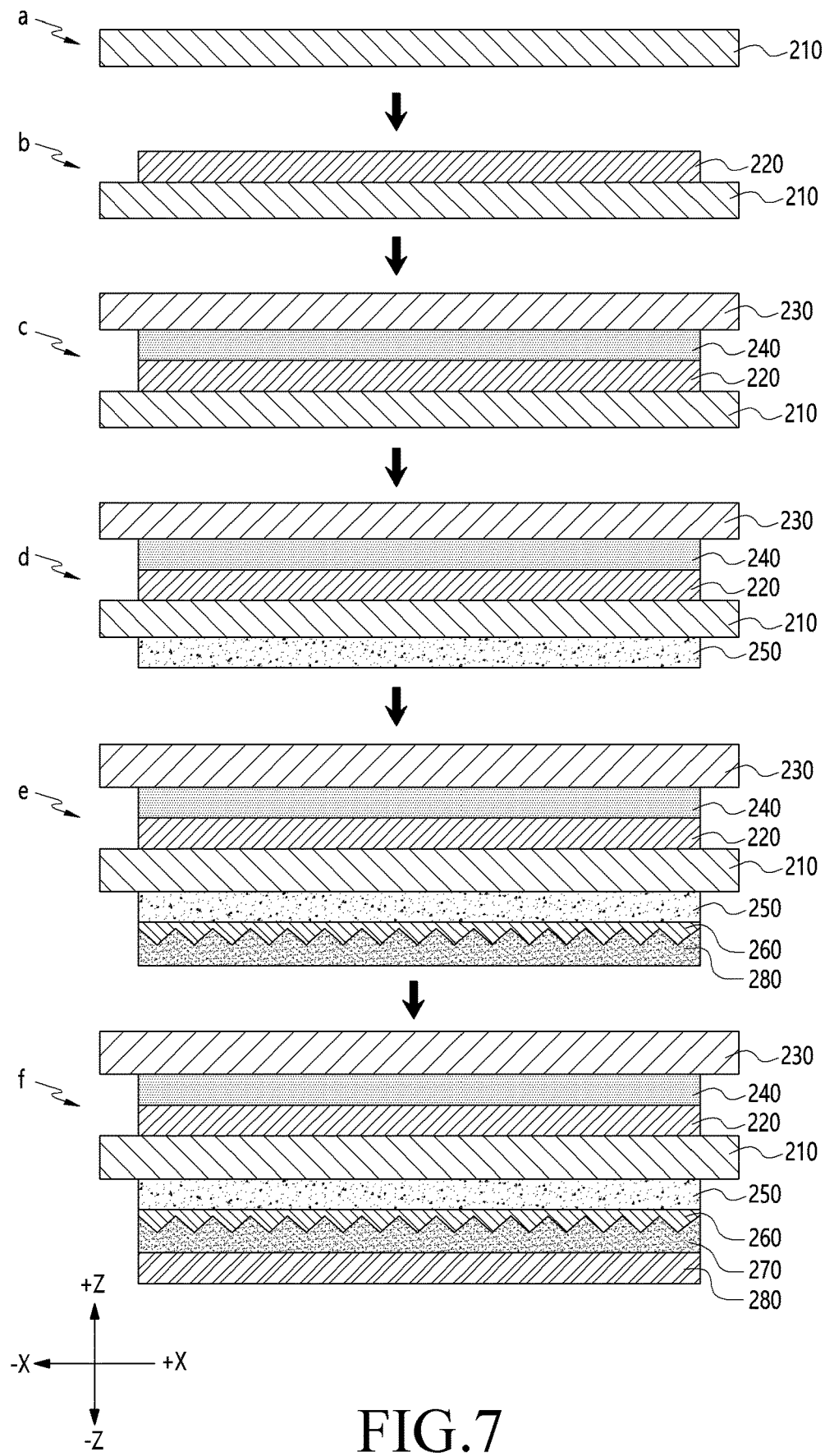
FIG. 7 schematically illustrates the flowchart in FIG. 5, and may provide processes of forming the cover member illustrated in FIG. 3.

FIG. 7 schematically illustrates the flowchart in FIG. 5, and may provide processes of forming the cover member 200 illustrated in FIG. 3.

In FIG. 7, "X" in a two-axis orthogonal coordinate system may refer to the longitudinal direction of the cover member 200, and "Z" in the two-axis orthogonal coordinate system may refer to the thickness direction of the cover member 200. Further, in an embodiment of the disclosure, "Z" may refer to a first direction (+Z-axis direction) and a second direction (−Z-axis direction), and "X" may refer to a third direction (+X or −X).

Referring to FIGS. 5 and 7, the cover member 200 may be manufactured by laminating a plurality of layers. In the cover member 200, with reference to the substrate film layer 210, a plurality of layers may be laminated first in a first direction (+Z-axis direction), and then a plurality of layers may be laminated in a second direction (−Z-axis direction).

The structures of the layers of the cover member 200 in FIG. 7 may be partially or totally identical to the structures of the layers of the cover member 200 in FIG. 6. The method for manufacturing the cover member 200 in FIG. 7 is different from the method for manufacturing the cover member 200 in FIG. 6 with respect to processes of forming the deposition layer 270 and the printing layer 280. Therefore, processes 10, 20, and 30 in FIG. 6 may be applied to processes 10, 20, and 30 in FIG. 7. Hereinafter, differences will be mainly described.

According to various embodiments, the cover member 200 may be manufactured to have a thickness of about 100 μm. In order to manufacture the cover member 200, the substrate film layer 210 may be provided (process (a) in FIG. 7). Subsequently, the metal-oxide layer 220 may be disposed on the upper surface of the substrate film layer 210 (process 10) (process (b) in FIG. 7). After the metal-oxide layer 220 is laminated, the transparent member 230 may be disposed on the upper surface of the metal-oxide layer 220 (process 20) (process (c) in FIG. 7). The primer layer 250 and the photocurable resin layer 260 may be disposed on the lower surface of the substrate film layer 210 (process 30) (process (d) in FIG. 7).

After the photocurable resin layer 260 is formed, the deposition layer 270 may be disposed on the lower surface of the photocurable resin layer 260 (process 40) (process (e) in FIG. 6). The deposition layer 270 may be disposed on a surface of the photocurable resin layer 260 that faces the second direction (−Z-axis direction), and may include recesses corresponding to the micropattern structure so as to receive the micropattern structure.

According to an embodiment, the deposition layer 270 may be formed as at least one layer. For example, the deposition layer 270 formed as one layer may be formed, using an electron beam (E-beam) evaporator, as a deposition layer including an indium oxide and at least one of TiO2, SiO2, and Al2O3. In another example, the deposition layer 270 formed as a plurality of layers may be formed by alternately depositing two materials (e.g., an indium oxide and at least one of TiO2, SiO2, and Al2O3 are used), different in reflectivity from each other, by using an electron beam (E-beam) evaporator. In the deposition layer 270, a silver color may be implemented as a base color. Due to the laminated structure in which the deposition layer 270 is laminated with the primer layer 250 having a translucent color, the deposition layer 270 may implement various colors while a silver color is a base color, and may implement a high-yield color layer, the overall uniformity of which is not reduced depending on the direction of light.

According to an embodiment, the deposition layer 270 may be manufactured using physical vapor deposition such as sputtering. When the deposition layer 270 is formed by sputtering, the deposition layer 270 including at least one of materials such as Nb2O5, ZnS, TiO, SiO, Al, Sn, or Tin may be deposited. The deposition layer 270 is a thin film, and exhibits diffuse reflection and interference effects together with the metal-oxide layer 220, whereby the cover member 200 exhibiting a perception of depth can be provided.

After the deposition layer 270 is formed, the printing layer 280 may be disposed on the lower surface of the deposition layer 270 (process 50) (process (f) in FIG. 6). The printing layer 280 may be disposed on a surface of the deposition layer 270, facing the second direction (−Z-axis direction), and may be formed as one layer. The printing layer 280 may prevent a phenomenon of light leakage from an electronic device, or may block light provided from the outside to the electronic device.

Figure 8A:
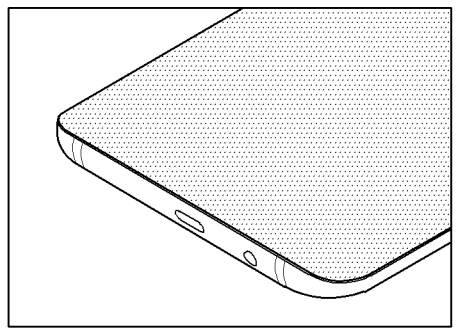
FIGS. 8A and 8B are photographs showing a cover member of an electronic device according to various embodiments of the disclosure from different directions.
Figure 8B:
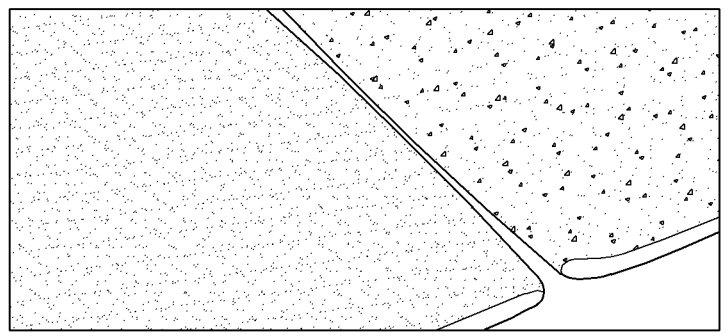

FIGS. 8A and 8B are photographs showing a cover member of an electronic device according to various embodiments of the disclosure.

The cover member illustrated in FIGS. 8A and 8B may have a configuration partially or totally identical to the configuration of the cover member illustrated in FIGS. 1 to 7.

Examining the photographs in FIGS. 8A and 8B, it may be confirmed that, in the cover member according to the disclosure, an impression of color providing a perception of depth has been implemented. According to an embodiment, a micropattern structure (a plurality of pyramid shapes) formed on a photocurable layer, which is one element of the cover member, may give the same interference effect and diffuse reflection as a prism, and thus may provide, to the cover member, a color showing a perception of depth. In another example, together with the micropattern structure formed on the photocurable resin layer, the laminated structure of a deposition layer formed using electron beams and a metal-oxide layer formed through sputter deposition may provide a color showing a perception of depth to the cover member through an additional interference effect and additional diffuse reflection.

According to an embodiment, it may be determined that the surface of the cover member according to the disclosure is implemented so as to have a ceramic texture, which is highly demanded in design. For example, the metal-oxide layer and/or deposition layer of the cover member may be imparted with a ceramic texture by target implementation through a sputter deposition device. The texture of the surface of the cover member, such as a ceramic texture, may be identified using a colorimeter as shown in [Table 1].

[Table 1] below provides contents obtained by analyzing colorimeter values of a cover member implemented as a plurality of layers according to various embodiments of the disclosure.

TABLE 1

| | Sputter material | a | b | L | Transmittance (%) |
|---|---|---|---|---|---|
| Embodiment 1 | Nb2O5 | −0.1 | −13.7 | 68.02 | 90 |
| Embodiment 2 | ZnS | −0.3 | −10.56 | 58.84 | 88 |
| Embodiment 3 | SiO2 + TiO oxide | −3.6 | −9.2 | 65.13 | 67 |
| Embodiment 4 | Nb2O5 + SiO oxide | −2.7 | −4.9 | 42.34 | 85 |

As shown in [Table 1], values of the colorimeter based on <Embodiments 1 to 4> may be identified. Here, the L values indicate brightness (luminance), values of (a) are color values, and indicate red as the (+) value becomes greater and green as the (−) value becomes greater. Values of (b) are chroma values, and indicate yellow as the (+) value becomes greater and blue as the (−) value becomes greater.

Embodiment 1

In Embodiment 1, a deposition process was performed using Nb2O5 as a target material for sputtering. As a result of the sputtering, it may be determined that the brightness (L) value in the colorimeter is about 68.02. It may be determined that the color (a) value in the colorimeter is about −0.1 and that the chroma (b) value is about −13.7. Further, it may be determined that the value of the transmittance (%) is about 90.

Embodiment 2

In Embodiment 2, a deposition process was performed using ZnS as a target material for sputtering. As a result of the sputtering, it may be determined that the brightness (L) value in the colorimeter is about 58.84. It may be determined that the color (a) value in the colorimeter is about −0.3 and that the chroma (b) value is about −10.56. Further, it may be determined that the value of the transmittance (%) is about 88.

Embodiment 3

In Embodiment 3, a deposition process was performed using an oxide of SiO2 and TiO as a target material for sputtering. As a result of the sputtering, it may be determined that the brightness (L) value in the colorimeter is about 65.13. It may be determined that the color (a) value in the colorimeter is about −3.6 and that the chroma (b) value is about −9.2. Further, it may be determined that the value of the transmittance (%) is about 67.

Embodiment 4

In Embodiment 4, a deposition process was performed using an oxide of Nb2O5 and SiO as a target material for sputtering. As a result of the sputtering, it may be determined that the brightness (L) value in the colorimeter is about 43.34. It may be determined that the color (a) value in the colorimeter is about −2.7 and that the chroma (b) value is about −4.9. Further, it may be determined that the value of the transmittance (%) is about 85.

When examining glossmeter analysis values of the cover member in <Embodiment 1 1> to <Embodiment 4>, it may be determined that when an oxide (e.g., a TiO oxide or SiO oxide) as a target material for sputtering is added, the (L) value is decreased. In another example, it may be determined that when an oxide (e.g., a TiO oxide or SiO oxide) as a target material for sputtering is added, the color (a) value is decreased and the chroma (b) value is increased. Therefore, a cover member according to an embodiment of the disclosure may be implemented as a cover member having high transmittance while having a low chroma and a blurry color by adjusting a color (a) and a chroma (b) through a deposition method such as sputtering, whereby a plate material having a soft ceramic texture can be manufactured.

According to an embodiment, it may be determined that a cover member according to the disclosure implements a uniform chromatic color throughout the cover member. The cover member may be provided in a laminated structure of a primer layer and a deposition layer. The deposition layer may implement various silver colors through a deposition process for a compound of an indium oxide and at least one of TiO2, SiO2, and Al2O3. The primer layer may be implemented with a translucent chromatic color. The laminated structure of the primer layer and the deposition layer may implement a high-yield color layer, the overall uniformity of which is not reduced depending on the direction of light.

A cover member (e.g., the cover member 200 in FIG. 2) of an electronic device (e.g., the electronic device 100 in FIG. 1) according to various embodiments of the disclosure may include: a substrate film layer (e.g., the substrate film layer 210 in FIG. 2); a metal-oxide layer (e.g., the metal-oxide layer 220 in FIG. 2) disposed on the upper surface of the substrate film layer and formed by sputtering; a transparent member (e.g., the transparent member 230 in FIG. 2) bonded to the upper surface of the metal-oxide layer; a primer layer (e.g., the primer layer 250 in FIG. 2) disposed on the lower surface of the substrate film layer and made of a translucent material; and a photocurable resin layer (e.g., the photocurable resin layer 260 in FIG. 2) disposed on the lower surface of the primer layer and including a pattern structure having a designated three-dimensional shape on a surface thereof.

According to various embodiments, the cover member may further include a deposition layer (e.g., the deposition layer 270 in FIG. 2), which is disposed on the lower surface of the photocurable resin layer and includes at least one layer formed through electron beam (E-beam) deposition or sputtering.

According to various embodiments, the pattern structure of the photocurable resin layer may include a plurality of quadrangular pyramid shapes, an array of the plurality of quadrangular pyramid shapes may form a periodic pattern, and each of the quadrangular pyramid shapes may have an area decreasing in a direction away from the primer layer.

According to various embodiments, the pattern structure of the photocurable resin layer may include an array of a plurality of three-dimensional shapes, a width of a surface of each three-dimensional shape may have a value of 25 μm to 50 μm, and a height, perpendicular to the width, may have a value of 3 μm to 10 μm.

According to various embodiments, the photocurable resin layer may include a first surface facing the primer layer and a second surface facing the inside of the electronic device, and the pattern structure may include an array of a plurality of three-dimensional shapes and may be formed over the entirety of the second surface.

According to various embodiments, a deposition material for sputtering the metal-oxide layer may include at least one of materials such as Nb2O5, ZnS, TiO, SiO, Al, Sn, or Tin.

According to various embodiments, a dielectric layer (e.g., the dielectric layer 240 in FIG. 2) may be disposed between the transparent member and the metal-oxide layer, and the dielectric layer may be provided as an optically transparent adhesive layer to bond the transparent member to the metal-oxide layer.

According to various embodiments, the electronic device may further include a printing layer (e.g., the printing layer 280 in FIG. 2) disposed on the lower surface of the photocurable resin layer and configured to block the path of light emitted out of or into the electronic device, and a surface of the printing layer may be provided to have a shape corresponding to the pattern structure of the photocurable resin layer.

According to various embodiments, the electronic device may further include a printing layer (e.g., the printing layer 280 in FIG. 3) disposed on the lower surface of the deposition layer, and configured to block the path of light emitted out of or into the electronic device.

According to various embodiments, the deposition layer may be arranged so as to be in contact with the photocurable resin layer and the printing layer, and a surface of the deposition layer may be provided to have a recess shape corresponding to the pattern structure of the photocurable resin layer.

According to various embodiments, a deposition material used for the deposition layer may include an indium oxide and an additional additive, and the additional additive may include at least one of TiO2, SiO2, or Al2O3.

According to various embodiments, the primer layer may be formed with a chromatic color.

According to various embodiments, external light may pass through the transparent member, may form the path of light undergoing interference or reflected by the metal-oxide layer and the deposition layer, laminated and spaced apart from each other, and may then be transferred to the outside so as to transfer a designated color to an external object.

According to various embodiments, the cover member may transfer a uniform color to the outside in response to the direction of external light, owing to the deposition layer having a silver color and the primer layer formed with a chromatic color.

An electronic device (e.g., the electronic device 100 in FIG. 1) according to various embodiments of the disclosure may include a housing (e.g., the housing 110 in FIG. 1) including a front cover (e.g., the front cover 111 in FIG. 1)

facing a first direction and a rear cover (e.g., the rear cover 112 in FIG. 1) facing a second direction opposite to the direction faced by the front cover, the front cover including a transparent region in at least a portion thereof; a battery (e.g., the battery 160 in FIG. 1) disposed in the housing; and a display device (e.g., the display device 120 in FIG. 1) disposed in the housing and including a screen region exposed through the front cover. The rear cover may include: a substrate film layer (e.g., the substrate film layer 210 in FIG. 3); a metal-oxide layer (e.g., the metal-oxide layer 220 in FIG. 3) disposed on a surface of the substrate film layer, facing the first direction, and formed by sputtering; a transparent member (e.g., the transparent member 230 in FIG. 3) bonded to a surface of the metal-oxide layer, facing the first direction; a primer layer (e.g., the primer layer 250 in FIG. 3) made of a translucent material and disposed on a surface of the substrate film layer, facing the second direction; a photocurable resin layer (e.g., the photocurable resin layer 260 in FIG. 3) including a pattern structure having a designated three-dimensional shape on a surface thereof and disposed on a surface of the primer layer, facing the second direction; and a deposition layer (e.g., the deposition layer 270 in FIG. 3) formed through an electron beam (E-beam) evaporation or sputtering, and disposed on a surface of the photocurable resin layer, facing the second direction.

According to various embodiments, the pattern structure of the photocurable resin layer may include a plurality of quadrangular pyramid shapes, an array of the plurality of quadrangular pyramid shapes may form a periodic pattern, and each of the quadrangular pyramid shapes may have an area decreasing in the second direction.

According to various embodiments, a dielectric layer formed as a transparent adhesive layer is disposed between the transparent member and the metal-oxide layer, and the electronic device may further include a printing layer which is disposed on a surface of the photocurable resin layer, facing the second direction, and is configured to block the path of light emitted out of or into the electronic device.

According to various embodiments of the disclosure, a method for manufacturing a cover member disposed in an electronic device may include: disposing a metal-oxide layer on the upper surface of a substrate film layer by sputtering (e.g., process 10 in FIG. 5); disposing a transparent member made of a glass material on the upper surface of the metal-oxide layer, (e.g., process 20 in FIG. 5); disposing, on the lower surface of the substrate film layer, a primer layer and a photocurable resin layer including a pattern structure having a designated three-dimensional shape (e.g., process 30 in FIG. 5); and disposing, on the lower surface of the photocurable resin layer, a printing layer configured to block the path of light emitted out of or into the electronic device (e.g., process 40 in FIG. 5).

According to various embodiments, the method may further include disposing a deposition layer on the lower surface of the photocurable resin layer by electron beam (E-beam) evaporation or sputtering after the disposing of the photocurable resin layer (e.g., process 40 in FIG. 5).

According to various embodiments, the pattern structure of the photocurable resin layer may include an array of a plurality of three-dimensional shapes, the width of a surface of each three-dimensional shape may have a value of 25 μm to 50 μm, and the height, perpendicular to the width, may have a value of 3 μm to 10 μm.

The above-described electronic device and cover member of the disclosure are not limited to the above-described embodiments and the drawings, and it will be apparent to those skilled in the art to which the disclosure belongs that various substitutions, modifications, and changes are possible within the scope of the disclosure.

The invention claimed is:

1. A cover member of an electronic device, comprising:
a substrate film layer;
a metal-oxide layer disposed on an upper surface of the substrate film layer and formed by sputtering;
a transparent member bonded to an upper surface of the metal-oxide layer;
a primer layer disposed on a lower surface of the substrate film layer and made of a translucent material;
a photocurable resin layer disposed on a lower surface of the primer layer and comprising a pattern structure including a designated three-dimensional shape on a surface thereof;
a deposition layer disposed on a lower surface of the photocurable resin layer, and comprising one surface facing the photocurable resin layer including a recess having a shape corresponding to the shape of the pattern structure and an opposite surface formed to be flat, wherein the deposition layer comprises at least one layer formed through electron beam (E-beam) evaporation or sputtering; and
a printing layer disposed on a lower surface of the deposition layer and configured to block a path of light emitted out of or into the electronic device.

2. The cover member of claim 1, wherein the pattern structure of the photocurable resin layer comprises a plurality of quadrangular pyramid shapes, an array of the plurality of quadrangular pyramid shapes forms a periodic pattern, and each of the quadrangular pyramid shapes has an area decreasing in a direction away from the primer layer.

3. The cover member of claim 1, wherein the pattern structure of the photocurable resin layer comprises an array of a plurality of three-dimensional shapes, a width of a surface of each three-dimensional shape has a value of 25 μm to 50 μm, and a height perpendicular to the width has a value of 3 μm to 10 μm.

4. The cover member of claim 1, wherein the photocurable resin layer comprises a first surface facing the primer layer and a second surface facing an inside of the electronic device, and the pattern structure comprises an array of a plurality of three-dimensional shapes and is formed over an entirety of the second surface.

5. The cover member of claim 1, wherein a deposition material for sputtering the metal-oxide layer comprises at least one of Nb2O5, ZnS, TiO, SiO, Al, or Tin materials.

6. The cover member of claim 1, wherein a dielectric layer is disposed between the transparent member and the metal-oxide layer, and the dielectric layer is provided as an optically transparent adhesive layer to bond the transparent member to the metal-oxide layer.

7. The cover member of claim 1, further comprising a printing layer disposed on a lower surface of the photocurable resin layer and configured to block a path of light emitted out of or into the electronic device,
wherein a surface of the printing layer is provided to have a shape corresponding to the pattern structure of the photocurable resin layer.

8. The cover member of claim 1, wherein the deposition layer is arranged to be in contact with the photocurable resin layer and the printing layer.

9. The cover member of claim 8, wherein a deposition material used for the deposition layer comprises an indium oxide and an additional additive, and the additional additive comprises at least one of TiO2, SiO2, or Al2O3.

10. The cover member of claim 1, wherein the primer layer is formed with a chromatic color.

11. The cover member of claim 1, wherein external light passes through the transparent member, forms a path of light undergoing interference or reflected by the metal-oxide layer and the deposition layer, laminated and spaced apart from each other, and is then transferred to an outside of the cover member so as to transfer a designated color to an external object.

12. The cover member of claim 1, wherein:
the deposition layer includes a silver-based color,
the primer layer is formed with a designated chromatic color, and
the cover member transfers a uniform color to an outside in response to a direction of external light by the deposition layer and the primer layer.

13. An electronic device comprising:
a housing comprising a rear cover facing a first direction and a front cover facing a second direction opposite to the first direction faced by the rear cover, the front cover comprising a transparent region in at least a portion thereof;
a battery disposed in the housing; and
a display device disposed in the housing and comprising a screen region exposed through the front cover,
wherein the rear cover comprises:
a substrate film layer;
a metal-oxide layer disposed on a surface of the substrate film layer, facing the first direction, and formed by sputtering;
a transparent member bonded to a surface of the metal-oxide layer, facing the first direction;
a primer layer made of a translucent material and disposed on a surface of the substrate film layer, facing the second direction;
a photocurable resin layer comprising a pattern structure having a designated three-dimensional shape on a surface thereof and disposed on a surface of the primer layer, facing the second direction; and
a deposition layer formed through an electron beam (E-beam) evaporation or sputtering, and disposed on a surface of the photocurable resin layer, facing the second direction, and comprising one surface facing the photocurable resin layer including a recess having a shape corresponding to the shape of the pattern structure and an opposite surface formed to be flat, wherein the deposition layer comprises at least one layer formed through electron beam (E-beam) evaporation or sputtering; and
a printing layer disposed on a lower surface of the deposition layer and configured to block a path of light emitted out of or into the electronic device.

* * * * *